(12) United States Patent
Voss et al.

(10) Patent No.: US 9,865,717 B2
(45) Date of Patent: Jan. 9, 2018

(54) SEMICONDUCTOR DEVICE

(71) Applicant: Infineon Technologies Austria AG, Villach (AT)

(72) Inventors: Stephan Voss, Munich (DE); Frank Dieter Pfirsch, Munich (DE)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 0 days.

(21) Appl. No.: 15/337,094

(22) Filed: Oct. 28, 2016

(65) Prior Publication Data

US 2017/0125560 A1 May 4, 2017

(30) Foreign Application Priority Data

Oct. 29, 2015 (DE) .................. 10 2015 118 550

(51) Int. Cl.

| | |
|---|---|
| *H01L 29/74* | (2006.01) |
| *H01L 31/111* | (2006.01) |
| *H01L 29/739* | (2006.01) |
| *H01L 29/10* | (2006.01) |
| *H01L 29/06* | (2006.01) |
| *H01L 29/66* | (2006.01) |

(52) U.S. Cl.
CPC ...... *H01L 29/7397* (2013.01); *H01L 29/0615* (2013.01); *H01L 29/0646* (2013.01); *H01L 29/1095* (2013.01); *H01L 29/66348* (2013.01)

(58) Field of Classification Search
CPC ............ H01L 29/7397; H01L 29/1095; H01L 29/7395; H01L 29/66348; H01L 29/0615; H01L 29/0623; H01L 29/0646

USPC ......................................................... 257/139
See application file for complete search history.

(56) References Cited

U.S. PATENT DOCUMENTS

| | | | | |
|---|---|---|---|---|
| 6,351,018 B1 * | 2/2002 | Sapp | ................... | H01L 27/0629 257/155 |
| 8,080,853 B2 * | 12/2011 | Tsuzuki | .............. | H01L 27/0664 257/330 |
| 9,214,521 B2 | 12/2015 | Werber et al. | | |

FOREIGN PATENT DOCUMENTS

| | | |
|---|---|---|
| DE | 10 2013 211 572 A1 | 12/2013 |
| JP | 2010 186805 A | 8/2010 |

* cited by examiner

*Primary Examiner* — Theresa T Doan
(74) *Attorney, Agent, or Firm* — Volpe and Koenigm P.C.

(57) ABSTRACT

A semiconductor device includes transistor cells formed inside a semiconductor body. First and second semiconductor well regions have second conductivity type dopants and are arranged external of the transistor cells. The first semiconductor well region is arranged between two transistor cells and the second semiconductor well region is electrically connected with a load contact. A separation region has first conductivity type dopants and extends from a surface of the semiconductor body along the vertical direction and is arranged between and in contact with each of the first and second semiconductor well regions. The first semiconductor well region extends at least as deep as each of body regions of two transistor cells. A transition in a first lateral direction between the separation and first semiconductor well regions extends continuously from the surface to a point in the semiconductor body at least as deep as each body region of two transistor cells.

15 Claims, 6 Drawing Sheets

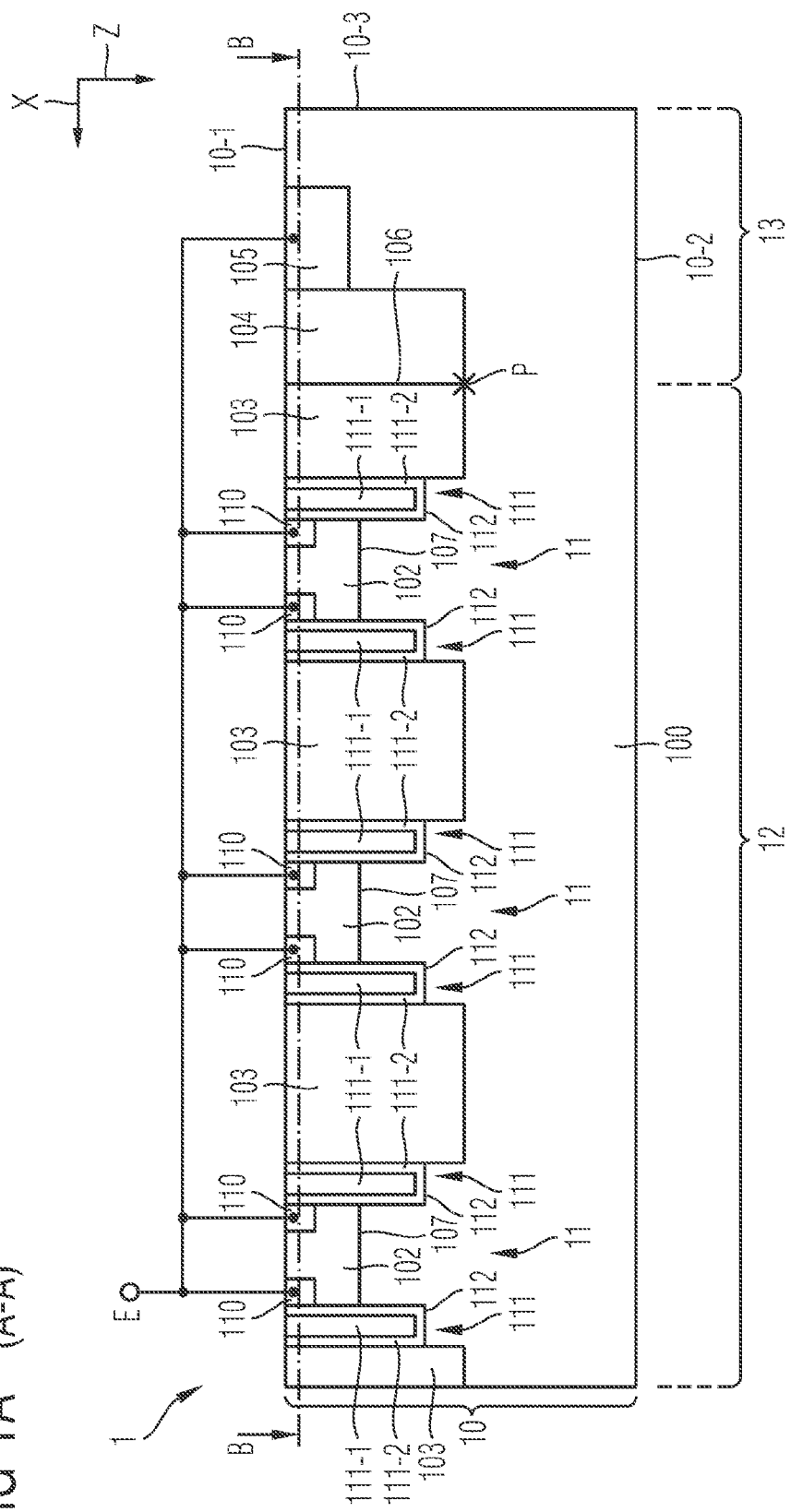

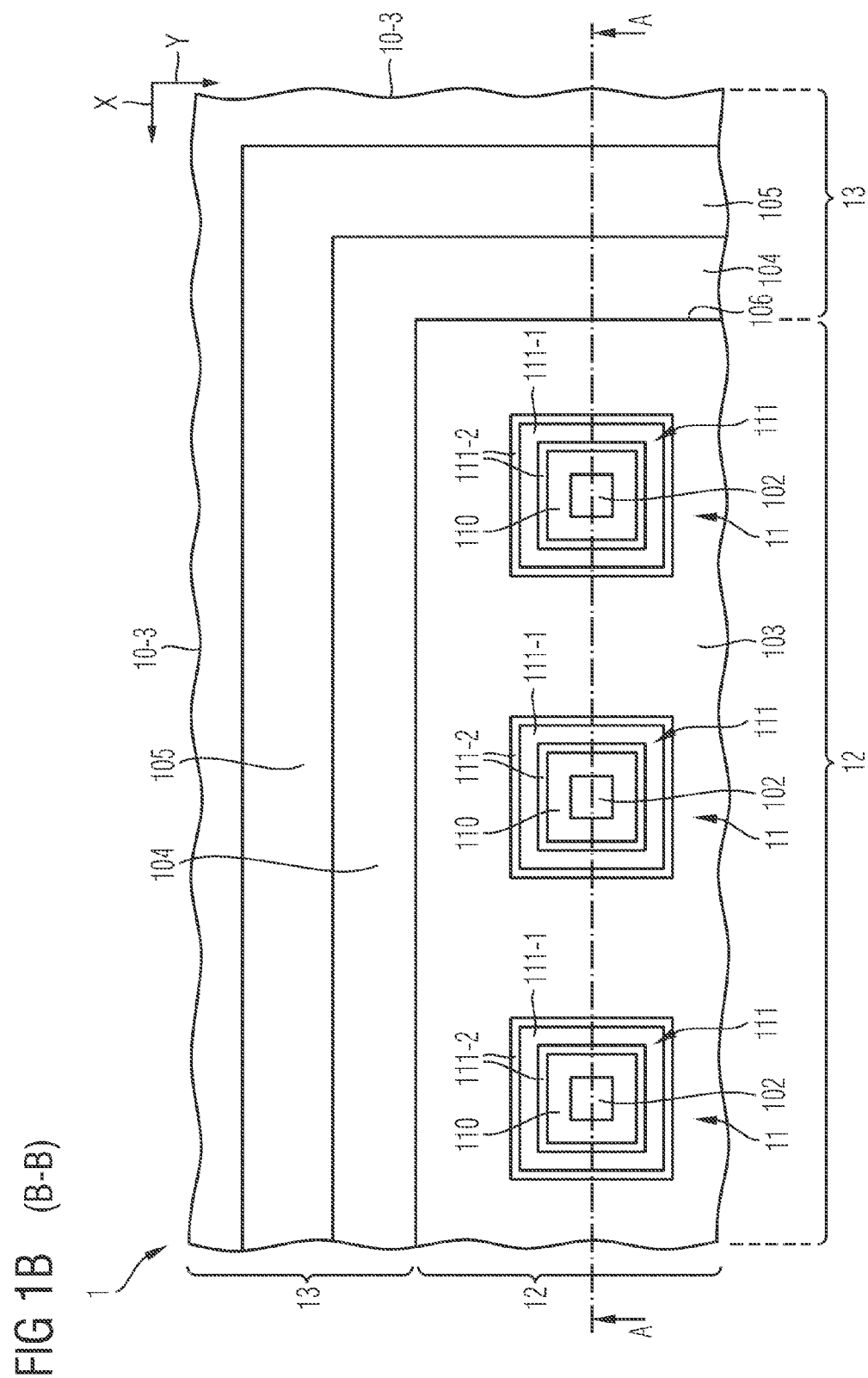

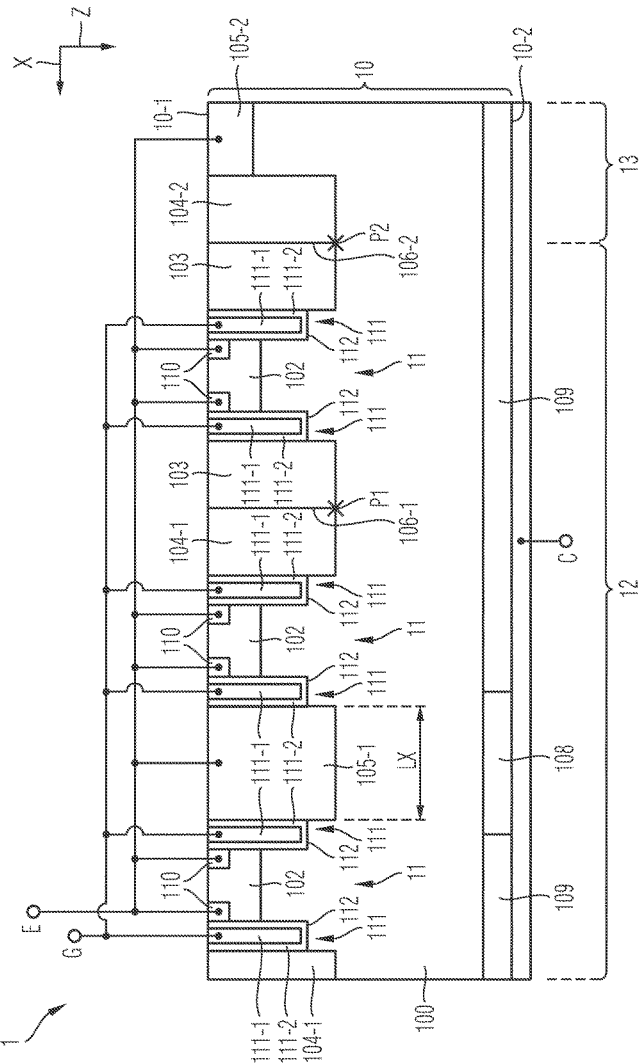

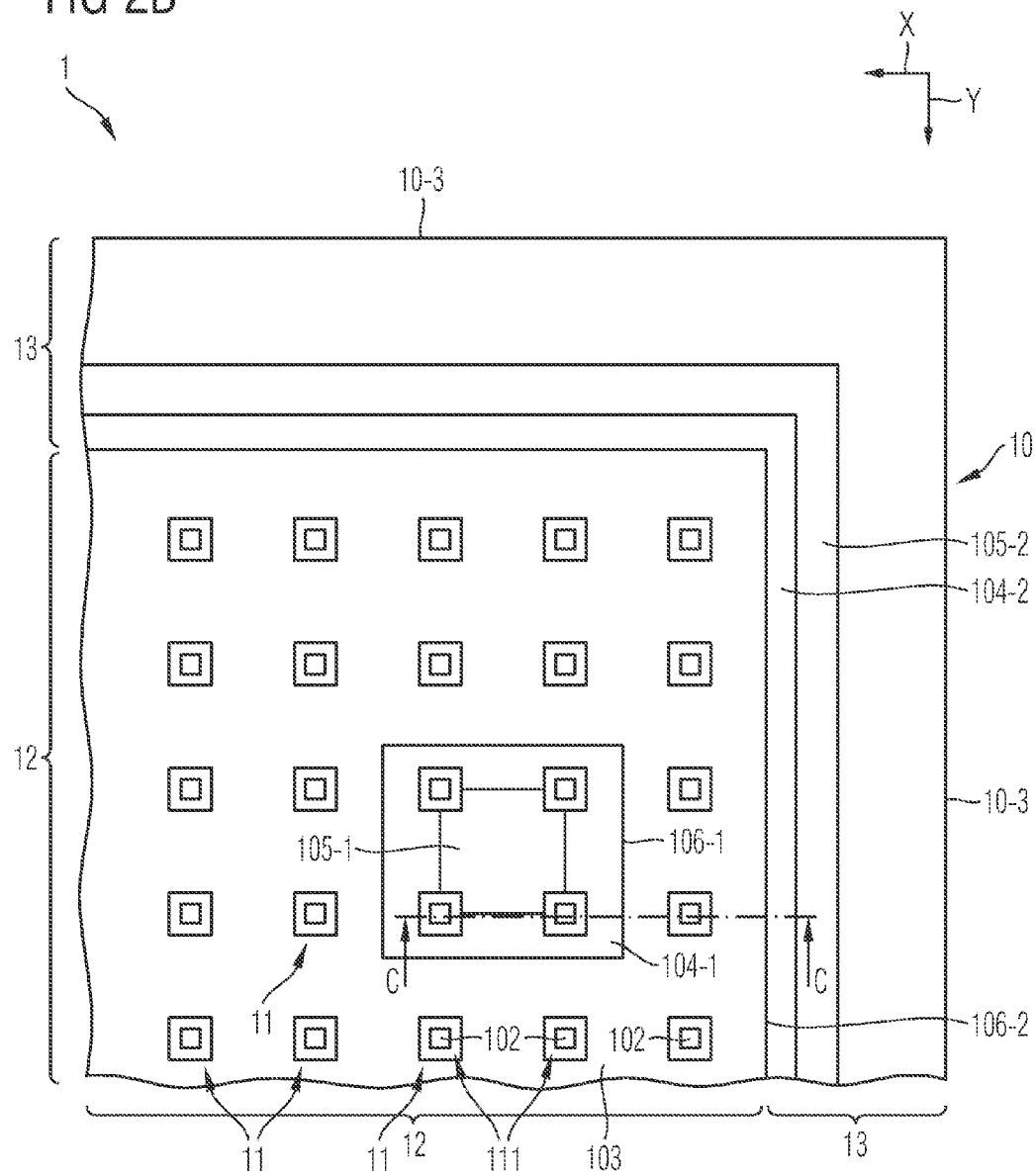

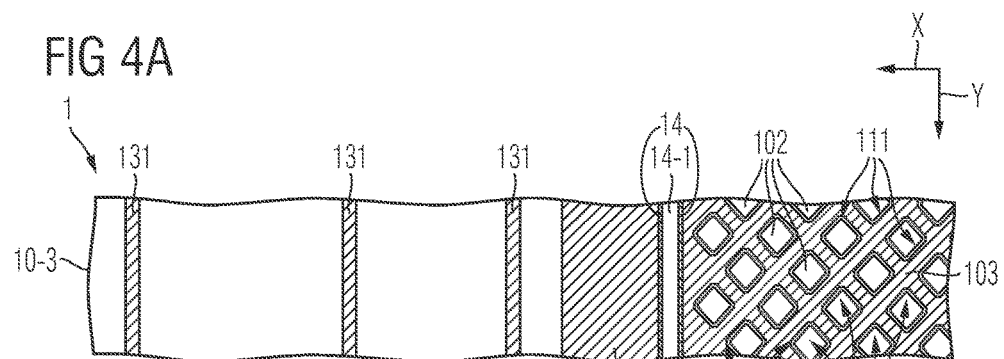
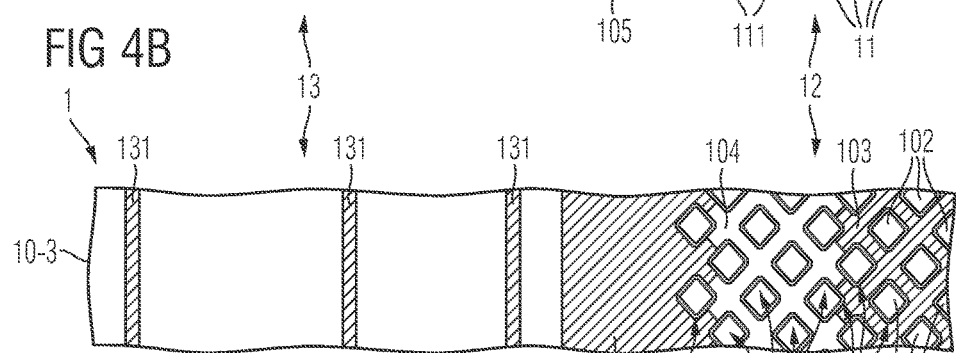
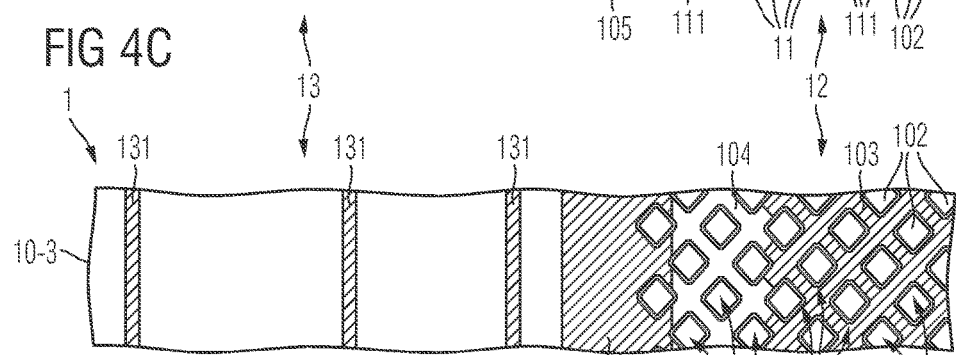
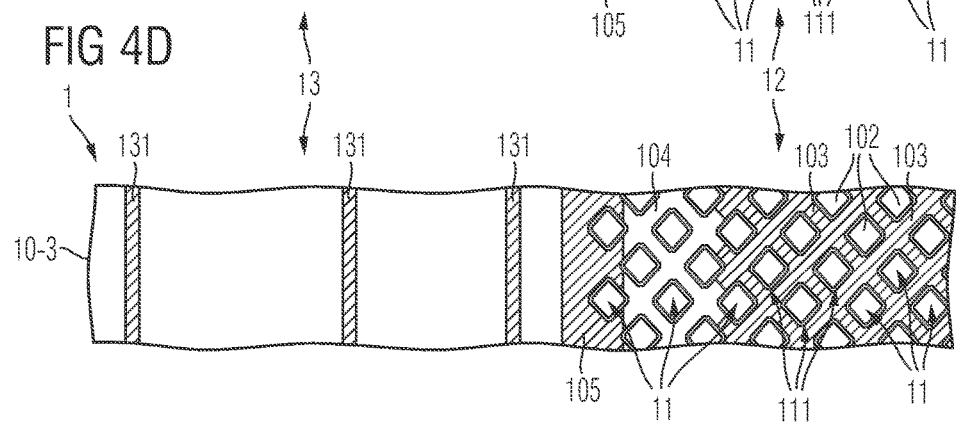

SEMICONDUCTOR DEVICE

FIELD

This specification refers to embodiments of a semiconductor device and to embodiments of a method of producing a semiconductor device. In particular, this specification refers to embodiments of a semiconductor device including a plurality of transistor cells and semiconductor well regions being arranged external of the transistor cells and to embodiments of a method of producing such a semiconductor device.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Often, a power semiconductor device comprises a plurality of transistor cells and deep semiconductor well regions arranged external of the transistor cells.

For example, such a deep semiconductor well region may be a floating semiconductor region having dop ants of the same conductivity type as a body region of each transistor cell. The purpose of such a floating semiconductor well region can be, e.g., carrier flooding during operation of the semiconductor device or protection a bottom of a gate trench of each transistor cell.

Further, a semiconductor well region that is electrically connected with a source contact of the semiconductor device can be arranged in an edge zone of the semiconductor device. For example, the semiconductor well region in the edge zone surrounds the transistor cells being arranged in an active zone. Such a structure may be provided for diverting currents in the vicinity of edges of the semiconductor device. For example, such a structure may be provided for diverting a hole current during a switch-off process of the semiconductor device.

SUMMARY

According to an embodiment, a semiconductor device is provided. The semiconductor device comprises: a semiconductor body having a surface and including a drift region having dopants of a first conductivity type; a first load contact configured for feeding a load current into the semiconductor body and being arranged in contact with the surface; and a plurality of transistor cells being formed at least partially inside the semiconductor body. Each transistor cell includes a section of the drift region and a body region having dopants of a second conductivity type complementary to the first conductivity type, wherein a transition between the body region and the drift region forms a pn-junction. The semiconductor body further comprises at least one first semiconductor well region having dop ants of the second conductivity type and being arranged external of the transistor cells and at least partially between at least two transistor cells. The at least one first semiconductor well region extends from the surface along a vertical direction at least as deep as each of the body regions of the at least two transistor cells. In addition, the semiconductor body comprises at least one second semiconductor well region having dopants of the second conductivity type and being arranged external of the transistor cells, wherein the at least one second semiconductor well region is electrically connected with the first load contact. At least one separation region comprised in the semiconductor body extends from the surface along the vertical direction. The at least one separation region has dopants of the first conductivity type and is arranged between and in contact with each of the at least one first semiconductor well region and the at least one second semiconductor well region, wherein a transition in a first lateral direction between the at least one separation region and the at least one first semiconductor well region extends continuously from the surface to a point in the semiconductor body positioned at least as deep as each of the body regions of the at least two transistor cells.

According to a further embodiment, a further semiconductor device is presented. The semiconductor device comprises a semiconductor body having a surface, wherein the semiconductor body comprises an active zone including a plurality of transistor cells, each transistor cell including a section of a drift region having dopants of the first conductivity type and a body region having dopants of a second conductivity type complementary to the first conductivity type, wherein a transition between the body region and the drift region forms a pn-junction. The semiconductor body further comprises an edge zone surrounding the active zone and forming lateral edges of the semiconductor body. The active zone further comprises at least one first semiconductor well region having dopants of the second conductivity type. The at least one first semiconductor well region is arranged external of the transistor cells and at least partially between at least two transistor cells and extends from the surface along the vertical direction at least as deep as each of the body regions of the at least two transistor cells. The edge zone and the active zone each comprise at least one second semiconductor well region having dopants of the second conductivity type and being arranged external of the transistor cells, wherein the at least one second semiconductor well region is electrically connected with the first load contact. At least one first separation region is arranged between and in contact with each of the at least one first semiconductor well region and the at least one second semiconductor well region located in the active zone, wherein the at least one first separation region extends from the surface along the vertical direction and has dop ants of the first conductivity type. In addition, at least one second separation region is arranged between and in contact with each of the at least one first semiconductor well region and the at least one second semiconductor well region located in the edge zone, wherein the at least one second separation region extends from the surface along the vertical direction and has dopants of the first conductivity type.

According to another embodiment, a method of producing a semiconductor device is presented. The method comprises: providing a semiconductor body having a surface and including a drift region having dopants of a first conductivity type; forming a plurality of transistor cells at least partially inside the semiconductor body, each transistor cell including a section of the drift region and a body region having dopants of the second conductivity type complementary to the first conductivity type, wherein a transition between the body region and the drift region forms a pn-junction; creating, in the semiconductor body, at least one first semiconductor well region having dopants of the second conductivity type and being arranged external of the transistor cells and at least partially between at least two transistor cells, the at least one first semiconductor well region extending from the surface along a vertical direction at least as deep as the body regions of the at least two transistor cells; creating, in the semiconductor body, at least one second semiconductor well region having dopants of the second conductivity type and being arranged external of the transistor cells; creating, in the semiconductor body, at least one separation region extending from the surface along the vertical direction and having dopants of the first conductivity type and being arranged between and in contact with each of the at least one first semiconductor well region and the at least one second semiconductor well region, such that a transition in a first lateral direction between the at least one separation region and the at least one first semiconductor well region extends continuously from the surface to a point in the semiconductor body positioned at least as deep as each of the body regions of the at least two transistor cells; and creating a first load contact being configured for feeding a load current into the semiconductor body and being arranged in contact with the surface, wherein the at least one second semiconductor well region is electrically connected with the first load contact.

Those skilled in the art will recognize additional features and advantages upon reading the following detailed description, and upon viewing the accompanying drawings.

BRIEF DESCRIPTION OF THE DRAWINGS

The parts in the Figures are not necessarily to scale, instead emphasis being placed upon illustrating principles of the invention. Moreover, in the Figures, like reference numerals designate corresponding parts. In the drawings:

FIG. 1A schematically illustrates a section of a vertical cross-section of a semiconductor device in accordance with one or more embodiments;

FIG. 1B schematically illustrates a section of a lateral cross-section of the semiconductor device of FIG. 1A;

FIG. 2A schematically illustrates a section of a vertical cross-section of a reverse conducting IGBT in accordance with one or more embodiments;

FIG. 2B schematically illustrates a section of a lateral cross-section of the reverse conducting IGBT of FIG. 2A;

FIG. 4A schematically illustrates a section of a lateral cross-section of a semiconductor device in accordance with one or more embodiments; and FIGS. 4B-4D each schematically illustrate a section of a lateral cross-section of a semiconductor device in accordance with one or more embodiments.

DETAILED DESCRIPTION

Figure 3A:
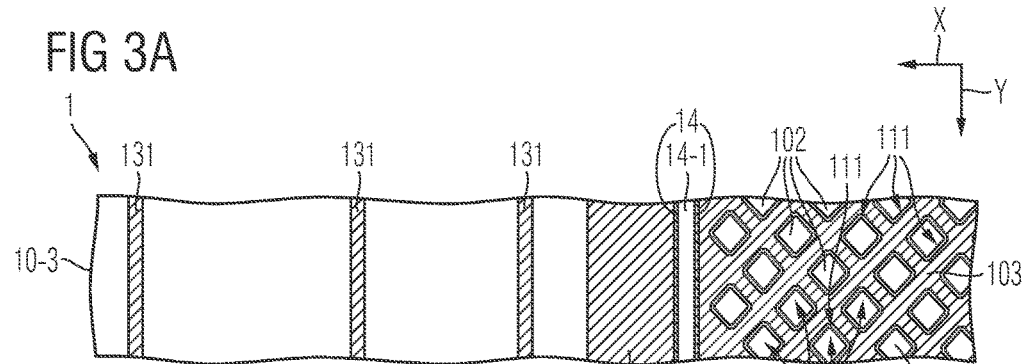
FIGS. 3A-3D each schematically illustrate a section of a lateral cross-section of a semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the Figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the vertical direction Z mentioned below may be a vertical direction Z is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device that may be used within a power converter or a power supply. For example, the power semiconductor device may comprise one or more power semiconductor cells, such as a monolithically integrated diode cell, and/or a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a power semiconductor module The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or 100 Ampere, and/or high voltages, typically above 5 V, more typically 15 V and above.

In the following, reference will be made to FIGS. 1A to 2B, which pertain to one or more embodiments of a semiconductor device 1, which are schematically illustrated in different cross-sectional views. Specifically, FIGS. 2A and 2B schematically illustrate different cross-sections of a reverse conducting IGBT in accordance with one or more embodiments.

FIG. 1A schematically illustrates a section of a vertical cross-section of a semiconductor device 1 in accordance with one or more embodiments. For example, the semiconductor device 1 is a power semiconductor device, such as a MOSFET, an IGBT or a reverse conducting IGBT. The semiconductor device 1 comprises a semiconductor body 10 that extends along a vertical direction Z, along a first lateral direction X and along a second lateral direction Y. FIG. 1A exemplarily shows a cross-section along the XZ-plane.

FIG. 1B schematically illustrates a top view of a lateral cross-section along the XY-plane of the semiconductor device 1 shown in FIG. 1A. In FIG. 1A, the dashed line marked with arrows B indicates the cross-section depicted in FIG. 1B. Likewise, in FIG. 1B, the dashed line marked with arrows A indicates the vertical cross-section shown in FIG. 1A.

As shown in FIG. 1A, the semiconductor body 10 has a surface 10-1 extending along the XY-plane and includes a drift region 100 having dopants of the first conductivity type. For example, the drift region 100 is an n-doped silicon substrate. In other embodiments, the drift region 100 may be p-doped. The drift region 100 can be configured for carrying a load current between a first load contact E arranged in contact with the surface 10-1 and a second load contact C arranged at a backside 10-2 of the semiconductor body 10, the backside 10-2 being located opposite to the surface 10-1, as shown in FIG. 2A.

For example, the first load terminal E may be or form a part of a front side metallization of the semiconductor device 1. For example, the first load terminal E may form a part of a source or emitter contact structure, and the second load terminal C may be or form a part of a drain or collector contact structure.

The second load terminal C may comprise a backside metallization, which may be in electric contact with sections of the semiconductor body 10, for example with a highly p-doped semiconductor contact layer 108, 109 (see FIG. 2A).

For example, the load current is received by means of the first load contact E and output by the second load contact C and/or vice versa.

In order to be able to carry and control the load current, the semiconductor device 1 includes, in an active zone 12, a plurality of transistor cells 11. The transistor cells 11 may comprise, for example, IGBT cells or MOSFET cells. Each transistor cell 11 is formed at least partially inside the semiconductor body 10 and includes a section of the drift region 100 for carrying at least a part of the load current in an on-state of the semiconductor device 1. In addition, each transistor cell 11 includes a body region 102 having dopants of the second conductivity type, which is complementary to the first conductivity type. For example, the body region 102 comprises p-type dopants, such as boron, which may have been implanted and/or diffused into an n-doped silicon substrate. The drift region 100 may be formed by a section of the n-doped silicon substrate.

A transition between the body region 102 and the drift region 100 forms a pn-junction 107, which may be configured for blocking a forward voltage applied between the first load contact E and the second load contact C in a blocking state of the semiconductor device 1. For example, the semiconductor device 1 is a power semiconductor device, wherein the pn-junction 107 is configured for blocking a forward voltage of up to several hundred V or even more than 1000 V.

Each transistor cell 11 further comprises at least one source region 110 having dopants of the first conductivity type and being formed inside the semiconductor body 10 in contact with the surface 10-1. The body region 102 isolates the source region 110 from the drift region 100. For example, the source regions 110 are n-doped semiconductor regions, which have been produced by implanting and/or diffusing n-type dopants, such as phosphorus, into the semiconductor body 10 from the surface 10-1.

Each transistor cell 11 further comprises a trench 111 that includes a control electrode 111-1 for controlling the respective transistor cell 11. As illustrated in the vertical cross-section of FIG. 1A, each trench 111 extends into the semiconductor body 10 from the surface 10-1 along the vertical direction Z and is vertically confined by a trench bottom 112. Inside each transistor cell 11, the trench 111 is in contact with the source regions 110, the body region 102, and the drift region 100.

The control electrode 111-1 included in each trench 111 may be insulated from the source regions 110, the respective body region 102, and the drift region 100 by an insulator 111-2. For example, the insulator 111-2 comprises an oxide. Each control electrode 111-1 may be electrically connected with a gate contact G, as illustrated in FIG. 2A. The gate contact G may be configured for receiving a control signal from external of the semiconductor device 1. The control electrode 111-1 may be configured for inducing a channel region, which extends inside the body region 102 between the source region 110 and the drift region 100, in dependence of the control signal.

In the exemplary embodiments shown in FIG. 1A to FIG. 2A, each trench 111 defines a substantially square-shaped transistor cell 11. In other embodiments, each trench 111 may, for example, exhibit a linear shape. A plurality of linear-shaped trenches 111 arranged in parallel to one another may define a plurality of stripe transistor cells 11 within the active zone 12 of the semiconductor body 10.

The semiconductor body 10 further comprises a first semiconductor well region 103 having dopants of the second conductivity type. The first semiconductor well region is arranged external of the transistor cells 11. In the exemplary embodiment of FIG. 1A, several portions of the first semiconductor well region 103 are each arranged between two transistor cells 11.

The first semiconductor well region 103 may be electrically insulated from the first load contact E. For example, the first semiconductor well region 103 is a floating p-doped semiconductor region provided in between a plurality of n-channel IGBT cells 11 (see also FIG. 2B) and being configured for protecting the insulator 111-2 of the gate trenches 111 against high electric fields.

In the exemplary embodiment illustrated in FIG. 1A, the first semiconductor well region 103 extends from the surface 10-1 along the vertical direction Z deeper than the trenches 111. In other embodiments, the first semiconductor well region 103 may extend at the least as deep as the trenches 111 of two transistor cells 11, wherein the first semiconductor well region 103 is at least partially comprised in between said two transistor cells 11. In yet other embodiments, the first semiconductor well region 103 may extend from the surface 10-1 along the vertical direction Z merely at least as deep as each of the body regions 102 of said transistor cells 11.

In addition to the first semiconductor well region 103, the semiconductor body 10 comprises a second semiconductor well region 105 having dopants of the second conductivity type. The second semiconductor well region 105 is arranged external of the transistor cells 11 in an edge zone 13 of the semiconductor body 10, wherein the edge zone 13 surrounds the active zone 12 and forms lateral edges 10-3 of the semiconductor body 10 (see FIG. 1B). The edge zone 13 may comprise a junction termination structure (not depicted), the junction termination structure being configured for closing off a pn-junction at the surface 10-1 in the edge zone 13 in the blocking state of the semiconductor device 1. For example, the second semiconductor well region 105 may form a part of the junction termination structure.

The second semiconductor well region 105 may be electrically connected with the first load contact E. For example, the second semiconductor well region 105 is configured for dissipating a current flowing in the edge zone 13 of the semiconductor body 10. The second semiconductor well region 105 may surround the active zone 12. For example, the semiconductor device 1 is an n-channel IGBT, and the second semiconductor well region 105 is p-doped and electrically connected with the emitter contact E so as to be able to extract holes from the drift region 100 in the edge zone 13.

Between the first semiconductor well region 103 and the second semiconductor well region 105, a separation region 104 having dopants of the first conductivity type is provided. The separation region 104 extends from the surface 10-1 along the vertical direction Z. The separation region 104 is in contact with both the first semiconductor well region 103 and the second semiconductor well region 105.

The separation region 104 may be configured to isolate the first semiconductor well region 103 from the second semiconductor well region 105. For example, the separation region 104 surrounds the first semiconductor well region 103.

As depicted in FIG. 1A, a transition 106 in the first lateral direction X between the separation region 104 and the first semiconductor well region 103 extends continuously from the surface 10-1 to a point P in the semiconductor body 10. The point P is positioned deeper below the surface 10-1 than the trench bottoms 112. In other embodiments, the point P may be positioned approximately as deep as the trench bottoms 112. In yet other embodiments, the point P may be positioned merely at least as deep as each of the body regions 102 of two transistor cells 11, between which the first semiconductor well region 103 is at least partially comprised. This is to say that the transition 106 may extend at least as deep as each of the body regions 102 of said two transistor cells 11 reaches along the vertical direction Z.

A transition 106-3 in the first lateral direction X between the separation region 104 and the second semiconductor well region 105 may also extend continuously from the surface 10-1, as illustrated in FIG. 1A.

For example, the transition 106 in the first lateral direction X between the separation region 104 and the first semiconductor well region 103 and/or the transition between the 106-3 in the first lateral direction X between the separation region 104 and the second semiconductor well region 105 may extend from the surface substantially along the vertical direction Z.

The separation region 104 may comprise a plurality of transistor cells 11 at least partially (not depicted). For example, a plurality of transistor cells 11 may be embedded at least partially in the at least one separation region 104.

In the embodiment shown in FIG. 2A and FIG. 2B in different cross-sectional views, the semiconductor device 1 is a reverse conducting IGBT having a plurality of IGBT transistor cells 11, which include gate trenches 111, as described above in connection with FIG. 1A.

The description of the embodiment of FIG. 1A and FIG. 1B may pertain to the embodiment shown in FIG. 2A and FIG. 2B, and vice versa. For example, FIGS. 1A to 2B may pertain to the same embodiment, wherein different sections of different cross-sections of a semiconductor device 1 are shown in the different Figures. However, the embodiment shown in FIG. 1A and FIG. 1B described above may also be understood as being independent from the embodiments depicted in FIG. 2A and FIG. 2B.

As shown in FIG. 2A, a highly doped semiconductor layer 108, 109 is arranged at the backside 10-2 of the semiconductor body 10 in contact with the second load contact C. Said highly doped semiconductor layer 108, 109 comprises backside emitter regions 109 having dopants of the second conductivity type and short regions 108 having dopants of the first conductivity type. In FIG. 2A, only one short region 108 is shown exemplarily.

For example, the backside emitter regions 109 are p-doped and are provided to inject holes into an n-doped drift region in a forward conducting state of the reverse conducting IGBT 1. In this example, the short region 108 may be n-doped and may be provided to carry a part of a reverse current in a reverse conducting state of the IGBT 1.

A second semiconductor well region 105-1 having dopants of the second conductivity type is arranged external of the transistor cells 11. The second semiconductor well region 105-1 is located in the semiconductor body 10 opposite to the short region 108. The second semiconductor well region 105-1 is electrically connected with the first load contact E. Thus, the second semiconductor well region 105-1 may form at least a part of an anode of an intrinsic diode of the reverse conducting IGBT 1. The short region 108 may form at least a part of a cathode of said intrinsic diode.

The second semiconductor well region 105-1 and the short region 108 may exhibit a common lateral extension range LX along the first lateral direction X. In addition or alternatively, the second semiconductor well region 105-1 and the short region 108 may exhibit a common lateral extension range LY (not depicted) along the second lateral direction Y. For example, the common lateral extension range LX, LY is at least 10 µm, at least 20 µm, at least 50 µm, or even more than 100 µm.

In the embodiment shown in FIG. 2A, the second semiconductor well region 105-1 is arranged in the active zone 12 of the semiconductor body 10 between two transistor cells 11 and extends from the surface 10-1 along the vertical direction Z deeper than the trenches 111 of said two transistor cells 11. For example, the second semiconductor well region 105-1 may partially cover the trench bottoms 112 of said two transistor cells 11 (not depicted in FIG. 2A). Additionally or alternatively, a first semiconductor well region 103 may at least partially cover the trench bottoms 112 of two transistor cells 11, between which the first semiconductor well region 103 is arranged. The at least one first semiconductor well region 103 and/or the at least one second semiconductor well region 105-1 may thus be provided and configured for protecting the trench bottoms 112, e.g. from high electric fields.

In other embodiments, at least one second semiconductor well region 105-1 may extend from the surface 10-1 along the vertical direction Z merely at least as deep as each of the body regions 102 of two transistor cells 11, between which the second semiconductor well region 105-1 is comprised.

FIG. 2B shows a section of a lateral cross-section of the reverse conducting IGBT 1. A dashed line marked with arrows C indicates the location of the vertical cross-section depicted in FIG. 2A.

As can be seen in the cross-section of FIG. 2B, the second semiconductor well region 105-1 is arranged inside the active zone 12 in between four transistor cells 11. The second semiconductor well region 105-1 in the active zone 12 is surrounded by a first semiconductor well region 103 having dopants of the second conductivity type. For example, the first semiconductor well region 103 is a floating p-doped semiconductor region arranged in between a plurality of transistor cells 11 in the active zone 12.

A first separation region 104-1 having dopants of the first conductivity type is arranged between the first semiconductor well region 103 and the second semiconductor well region 105-1 in the active zone 12. In the cross-sectional view of FIG. 2B, the first separation region 104-1 surrounds the second semiconductor well region 105-1 located in the active zone 12 as a strip forming edges of a rectangle. The second semiconductor well region 105-1 and a part of each of the four transistor cells 11 are located inside said rectangle.

For example, in a lateral cross-section along the XY-plane (not depicted), the short region 108 arranged at the backside 10-2 may have a substantially rectangular shape similar to said rectangle defined by the first separation region 104-1. In other embodiments, the short regions 108 may have, for example, a disk-like shape or a substantially linear strip shape.

The short region 108 may have approximately the same shape and size as the second semiconductor well region 105-1 so as to exhibit a common lateral extension range LX, LY along both the first lateral direction X and the second lateral direction Y. An overlap region defined by the common lateral extension ranges LX, LY may form a diode region configured for carrying a part of a reverse current in a reverse conducting state of the semiconductor device 1. A plurality of such diode regions may be provided inside the active region 12.

The first separation region 104-1 is in contact with both the first semiconductor well region 103 and the second semiconductor well region 105-1 located in the active zone 12. For example, the first separation region 104-1 is configured for insulating the first semiconductor well region 103 from the second semiconductor well region 105-1 located in the active zone 12.

The edge zone 13 also comprises a second semiconductor well region 105-2 having dopants of the second conductivity type and being electrically connected with the first load contact E. For example, the second semiconductor well region 105-2 is configured for dissipating a current flowing in the edge zone 13, as described above with respect to the embodiment shown in FIG. 1A and FIG. 1B.

As illustrated in FIG. 2A and FIG. 2B, a second separation region 104-2 is arranged between and in contact with each of the first semiconductor well region 103 and the second semiconductor well region 105-2 located in the edge zone 13. The second separation region 104-2 has dopants of the first conductivity type and may be configured for insulating the first semiconductor well region 103 from the second semiconductor well region 105-2 in the edge zone 13.

For example, the first semiconductor well region 103 is a floating semiconductor region. The floating semiconductor region 103 may be insulated from the second semiconductor well regions 105-1, 105-2, which are electrically connected with the first load contact E, by the first separation region 104-1 and the second separation region 104-2, respectively.

For being able to insulate the second semiconductor well regions 105-1, 105-2 from the first semiconductor well region 103, the first and second separation regions 104-1, 104-2 may be weakly doped. For example, the first and second separation regions 104-1, 104-2 are n$^-$-doped semiconductor regions.

As shown in the vertical cross-section in FIG. 2A, a transition 106-1 in the first lateral direction X between the first separation region 104-1 and the first semiconductor well region 103 extends continuously from the surface 10-1 to a point P1, wherein the point P1 is positioned deeper than the trench bottoms 112 of the transistor cells 11. Likewise, a transition 106-1 in the first lateral direction X between the second separation region 104-2 and the first semiconductor well region 103 extends continuously from the surface 10-1 to a point P2, which is positioned deeper than the trench bottoms 112. In other embodiments, said transitions 106-1, 106-2 may extend only as deep as the trench bottoms 112 or even only as deep as the body regions 102 of the transistor cells 11.

The first separation region 104-1 and/or the second separation region 104-2 may comprise a plurality of transistor cells 11 at least partially (not depicted). For example, a plurality of transistor cells 11 are embedded at least partially in the second separation region 104-2. In addition or alternatively, a plurality of transistor cells 11 may be embedded at least partially in the first separation region 104-1.

FIGS. 3A to 3D each schematically illustrate a section of a lateral cross-section in an X-Y plane of semiconductor devices 1 in accordance with an embodiment.

In the embodiment shown in FIG. 3A, a double trench structure 14 is provided between an active zone 12 including a plurality of transistor cells 11 and an edge zone 13 that surrounds the active zone 11. At the same time, the double trench structure 14 separates a first semiconductor well region 103 and a second semiconductor well region 105. In the exemplary embodiment of FIG. 3A, said first semiconductor well region 103 is comprised within the active zone 12 and has dopants of a second conductivity type complementary to a first conductivity type of a drift region 100 (not depicted) of the semiconductor device 1.

As illustrated in FIG. 3A and described above with respect to the embodiments of FIGS. 1A to 2B, such a first semiconductor well region 103 may be arranged between the transistor cells 11 and may be electrically floating. Further, as illustrated in FIG. 3A, the edge zone 13 comprises said second semiconductor well region 105, which also has dopants of the second conductivity type and is electrically connected to a source or emitter terminal E of the semiconductor device 1. In addition, the edge zone 13 includes a plurality of guard rings 131 surrounding the active zone 11 and having dopants of the second conductivity type. For example, the guard rings 131 may be electrically floating.

The double trench structure may insulate the first semiconductor well region 103 and the second semiconductor well region 105 from each other. For example, the double trench structure comprises two trenches 14, each of which extends from a surface 10-1 into the semiconductor body 10 along the vertical direction Z (not depicted). For example, and n-doped region 14-1 may be arranged between said trenches 14 forming the double trench structure.

Figure 3B:
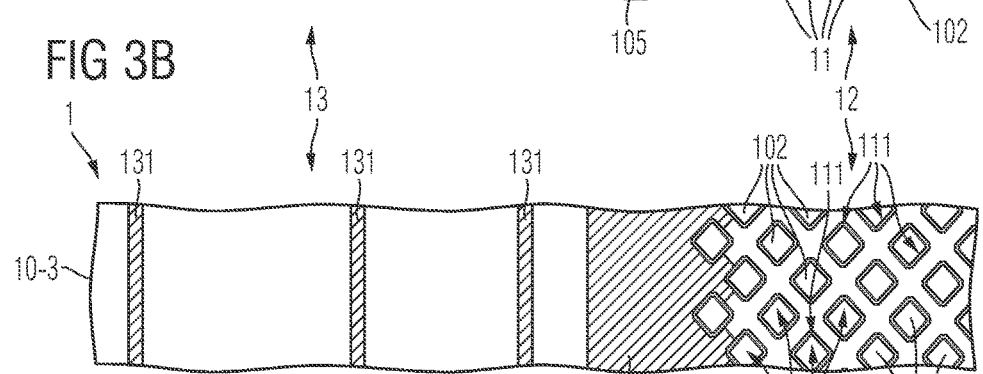
Figure 3C:
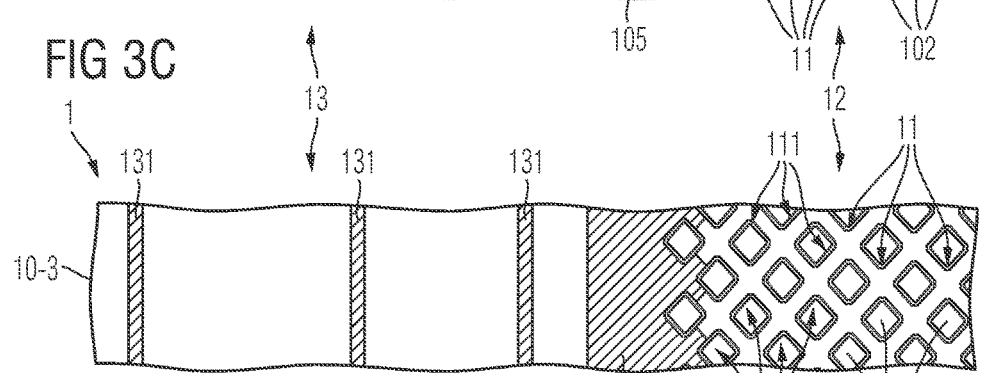
Figure 3D:
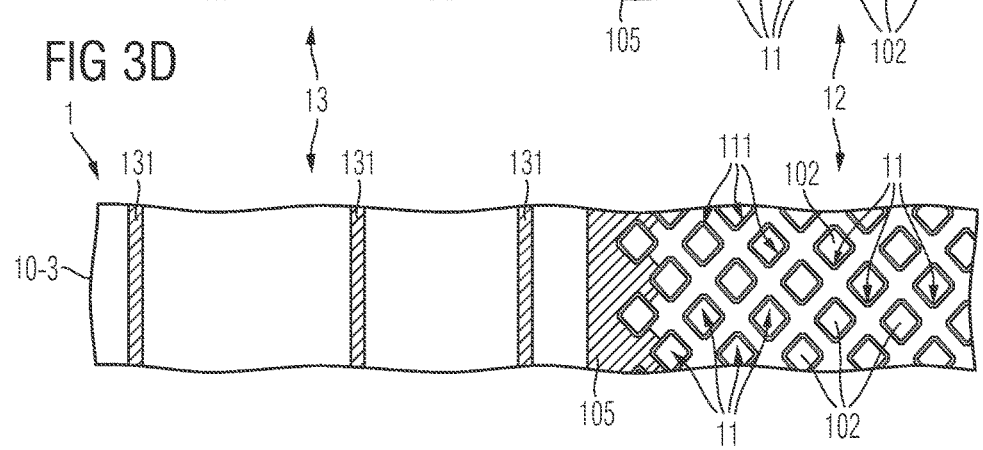

In the embodiments shown in FIGS. 3B and 3D, there is no first semiconductor well region 103 provided between the transistor cells 11 within the active 12 of the respective semiconductor device. Consequently, no double trench structure is required for establishing an electrical insulation from the second semiconductor well region 105. As becomes clear from the comparison of FIG. 3A and each of FIGS. 3B, 3D, omission of the trenches 14 may allow for providing, e.g., between 1 to 4 additional rows of transistor cells 11.

FIG. 4A is identical with FIG. 3A and is reproduced here for direct comparison with the embodiments illustrated in FIGS. 4B to 4D. All embodiments of a semiconductor device 1 shown in FIGS. 4B to 4D exhibit a first semiconductor well region 103 included in an active zone 11, wherein the first semiconductor well region 103 may be electrically connected with a source or emitter terminal E of the semiconductor device 1. In each case, the first semiconductor well region 103 is separated from a second semiconductor well region 105 by a separation region 104, as described further above with reference to the embodiments of FIGS. 1A to 2B.

As illustrated the different variant embodiments of FIGS. 4B to 4D, transistor cells 11 may be arranged within said separation region 104. Thus, for example, between 1 to 4 additional rows of transistor cells 11 may be provided.

In accordance with an embodiment, e.g., as schematically and exemplarily illustrated in each of FIGS. 3A-4D, the plurality of transistor cells 11 may be arranged along at least one horizontal path that extends in an angle greater than 5° and smaller than 85° with respect to at least one lateral edge 10-3 of the semiconductor body 10. For example, e.g., in accordance with the embodiments of FIGS. 3A-4D, the angel of the horizontal paths may amount to approximately 45° in each case. For example, such arrangement may reduce the mean distance between the transistor cells 11 to the edge region 13 and, consequently, the mean distance between the transistor cells 11 to the semiconductor regions that may be included in the edge region 13. Further, such arrangement may allow for using a common host material for forming the semiconductor body 10.

The semiconductor devices 1 shown in FIGS. 1A to 2B and in FIGS. 4B to 4D may have been produced by using a method of producing a semiconductor device 1, wherein a semiconductor body 10 having a surface 10-1 and including a drift region 100 having dopants of the first conductivity type is provided. For example and n-doped silicon substrate in the form of a semiconductor wafer is provided as the semiconductor body 10.

In a further step, a plurality of transistor cells 11 may be formed at least partially inside the semiconductor body 10, wherein each transistor cell 11 includes a section of the drift region 100 and a body region 102 having dopants of the second conductivity type. For example, the body region 102 is produced by diffusing and/or implanting p-type dopants, such as boron, from the surface 10-1 into the n-doped silicon substrate.

By creating the body region 102 in the semiconductor body 10, a pn-junction 107 may be formed as a transition between the drift region 100 and the body region 102.

Producing the plurality of transistor cells 11 may further include creating, inside each transistor cell 11, at least one source region 110 in the semiconductor body 10, wherein each source region 110 has dopants of the first conductivity type and is isolated from the drift region 100 by the body region 102.

Forming the transistor cells 11 may further comprise creating a plurality of trenches 111, which extend into the semiconductor body 10 from the surface 10-1 along the vertical direction Z. The trenches 111 may be created by using an etch process known in the art. Each trench 111 may be provided with the control electrode 111-1 for controlling the respective transistor cell 11. For example, the control electrode 111-1 is formed by a deposition of polysilicon inside the trenches 111.

The method of producing a semiconductor device 1 such as the ones described exemplarily with reference to FIGS. 1A to 2B further comprises a step of creating, in the semiconductor body 10, a first semiconductor well region 103 having dopants of the second conductivity type. The first semiconductor well region 103 is created such that it is arranged external of the transistor cells 11 and at least partially between at least two transistor cells 11.

Further, at least one second semiconductor well region 105, 105-1, 105-2 having dopants of the second conductivity type is created external of the transistor cells 11. For example, a second semiconductor well region 105, 105-1 is created in an active zone 12 of the semiconductor body 10 (see FIGS. 1A to 2B). In addition or alternatively, a second semiconductor well region 105-2 may be created in an edge zone 13 of the semiconductor body 10 (see FIGS. 2A to 2B).

For example, the first semiconductor well region 103 and/or the at least one second semiconductor well region 105, 105-1, 105-2 is created via an implantation and/or a diffusion of dopants of the second conductivity type (e.g. boron) from the surface 10-1 into the semiconductor body 10.

Said implantation and/or diffusion may be carried out so as to ensure that the first semiconductor well region 103 extends from the surface 10-1 along the vertical direction Z at least as deep as the body regions 102 of the at least two transistor cells 11.

For example, the body regions 102 and the first semiconductor well region 103 may be created in a common implantation and/or diffusion step.

In an embodiment, creating the first semiconductor well region 103 and/or the at least one second semiconductor well region 105, 105-1, 105-2 is carried out via an implantation of dopants of the second conductivity type at an implantation dose in the range from $10^{13}$ to $10^{15}$ cm$^{-2}$.

An implantation process for creating the at least one first semiconductor well region 103 and/or the at least one second semiconductor well region 105, 105-1, 105-2 may be followed by a temperature process. For example, such a temperature process may be carried out at temperatures in the range from 1000 to 1200° C. A duration of the temperature process may be, for example, in the range from 30 minutes to 10 hours.

In accordance with an embodiment, the at least one first semiconductor well region 103 and the at least one second semiconductor well region 105, 105-1, 105-2 are created via a masked implantation process. For example, a common masked implantation process may be used for creation each of the at least one first semiconductor well region 103 and the at least one second semiconductor well region 105, 105-1, 105-2. That is to say, a common mask or a common reticle may be used for carrying out said implantation process, wherein each of the at least one first semiconductor well region 103 and the at least one second semiconductor well region 105, 105-1, 105-2 are created.

In a variant, each of the at least one first semiconductor well region 103, the at least one second semiconductor well region 105, 105-1, 105-2, and at least one body region 102 of a transistor cell 11 are created using a common masked implantation process with dopants of the second conductivity type. Thus, forming the plurality of transistor cells 11 may include creating the body region 102 of each transistor cell 11 using said common masked implantation process.

The method further comprises creating, in the semiconductor body 10, at least one separation region 104, 104-1, 104-2 having dopants of the first conductivity type between and in contact with each of the at least one first semiconductor well region 103 and the at least one second semiconductor well region 105, 105-1, 105-2. The at least one separation region 104, 104-1, 104-2 may extend from the surface 10-1 along the vertical direction Z, such that a transition 106, 106-1, 106-2 in a first lateral direction X between the at least one separation region 104, 104-1, 104-2 and the at least one first semiconductor well region 103 extends continuously from the surface 10-1 to a point P, P1, P2 in the semiconductor body 10 positioned at least as deep as each of the body regions 102 of the at least two transistor cells 11.

In accordance with an embodiment, the at least one separation region 104, 104-1, 104-2 is created via an implantation and/or diffusion step, wherein dopants of the second conductivity type are implanted and/or diffused from the surface 10-1 into the semiconductor body for creating the at least one first semiconductor well region 103 and/or the at least one second semiconductor well region 105, 105-1, 105-2. For example, p-type dopants may be implanted in an n-doped semiconductor body 10 in a common masked implantation process for creating the at least one first semiconductor well region 103 and the at least one second semiconductor well region 105, 105-1, 105-2, as described above. The at least one separation region 104, 104-1, 104-2 may then be formed by portions of the n-doped semiconductor body 10, which are covered by a mask or reticle during the implantation process.

In accordance with a further embodiment, creating the at least one separation region 104, 104-1, 104-2 may include an implantation and/or diffusion of dopants of the first conductivity type from the surface 10-1 into the semiconductor body 10. For example, a masked implantation process may be used for obtaining a desired n-type dopant concentration of a separation region 104, 104-1, 104-2 arranged between a p-doped first semiconductor well region 103 and a p-doped second semiconductor well region 105, 105-1, 105-2.

An implantation of dopants of the first conductivity type for creating the at least one separation region 104, 104-1, 104-2 may be carried out, for example, at an implantation dose in the range from $10^{11}$ to $10^{13}$ cm$^{-2}$.

In a variant, an implantation and/or diffusion of dopants of the first conductivity type for obtaining a desired dopant concentration in the at least one separation region 104, 104-1, 104-2 may be carried out before dopants of the second conductivity type are implanted and/or diffused for creating the at least one first semiconductor well region 103 and/or the at least one second semiconductor well region.

The method of producing a semiconductor device 1 may further include creating a first load contact E being configured for feeding a load current into the semiconductor body 10 and being arranged in contact with the surface 10-1. To this end, for example, a metal may be deposited on the semiconductor body 10, wherein the metal forms at least a part of the first load contact E and is arranged in contact with the source regions 110. The first load contact E is arranged in contact with the at least one second semiconductor well region 105, 105-1, 105-2 is electrically connected with the first load contact E.

The embodiments schematically illustrated in FIG. 1A to FIG. 2B described above include the recognition that it may be sometimes desirable to insulate two or more deep semiconductor well regions extending from a surface into a semiconductor body from one another. For example, in a semiconductor device comprising a plurality of n-channel transistor cells in an active zone of a semiconductor body, a first semiconductor well region, which has p-type dopants and is electrically floating, may be arranged at least partially between said transistor cels. Such floating semiconductor well regions may be provided, for example, for improving a carrier flooding during operation of an IGBT and/or for protecting trench bottoms of gate trenches from high electric fields. Further, a second semiconductor well region having p-type dopants may be arranged in an edge zone of the semiconductor device, wherein the second semiconductor well region may be electrically connected with a source or emitter contact of the semiconductor device. For example, the second semiconductor well region may be configured for dissipating a current in the edge zone in a conducting state of the semiconductor device.

Sometimes, such a floating first semiconductor well region maybe insulated from such a second semiconductor well region being electrically connected with a source or emitter contact by one or more trenches, which extend into the semiconductor body from the surface. For example, to this end, a double trench structure may be provided between the first semiconductor well region and the second semiconductor well region. However, such trench structures may be costly in terms of active chip area, which could otherwise be used by functional transistor cells. Furthermore, additional process steps may be required for creating such trench structures. Thus, the overall costs of producing a semiconductor device may be increased with conventional solutions for insulating such first and second semiconductor well regions from one another.

In accordance with one or more embodiments, a separation region is arranged between and in contact with each of such a first semiconductor well region and such a second semiconductor well region. The separation region has dopants of the conductivity type that is complementary to the conductive the type of the dopants of the first and second semiconductor well regions. The separation region may extend into the semiconductor body from the surface along a vertical direction, wherein a transition in a first lateral direction between the separation region and the first semiconductor well region may extend continuously from the surface to a point in the semiconductor body positioned at least as deep as the body regions of the transistor cells. For example, by providing such a separation region instead of, e.g., a double trench structure, an overall chip area may be reduced. For example, a plurality of additional transistor cells may be embedded in the separation region. As a consequence, the costs of producing such a semiconductor device may be reduced as compared to methods known in the art.

For example, the semiconductor device may be a reverse conducting n-channel IGBT, wherein, in addition to the floating first semiconductor well region having p-type dopants, a second semiconductor well region having p-typed dopants and being electrically connected with an emitter contact is provided in the active zone. The second semiconductor well region may be arranged inside the active zone opposite to an n-doped short region, which may be provided at a backside of the semiconductor body. The n-doped short region may be configured for enabling a diode operation of the reverse conducting IGBT. Thus, a reverse current may flow through the short regions and through the first semiconductor well region in the active zone, which are electrically connected with the emitter contact. Such a second semiconductor well region located inside the active zone may be insulated from said first semiconductor well region by means of an n-doped separation region extending from the surface along the vertical direction.

Within a method of producing such a semiconductor device, said first and second semiconductor well regions and a plurality of body regions of the transistor cells may be created in a common masked implantation process. For example, the same mask and/or the same reticles may be used for creating the first and second semiconductor well regions and the body regions via an implantation of dopants. In a variant, the one or more separation regions arranged between the first semiconductor well regions and the second semiconductor well regions may also be created in said common masked implantation process. For example, the one or more separation regions are portions of an n-doped substrate, which is shadowed from an implantation of p-type dopants during said common masked implantation process. Thus, by means of said common method of producing a semiconductor device, the first and second semiconductor well regions and the one or more separation regions may be created in a cost-efficient manner.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor devices and to methods for producing a semiconductor device were explained. For example, these semiconductor devices are based on silicon (Si). Accordingly, a monocrystalline semiconductor region or layer, e.g., the semiconductor regions 10 and 100 to 109 of exemplary embodiments, can be a monocrystalline Si-region or Si-layer. In other embodiments, polycrystalline or amorphous silicon may be employed.

It should, however, be understood that the semiconductor regions 10 and 100 to 109 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor device comprising:
   a semiconductor body having a surface and including a drift region having dopants of a first conductivity type;
   a first load contact configured to feed a load current into the semiconductor body and being arranged in contact with the surface; and
   a plurality of transistor cells formed at least partially inside the semiconductor body, each transistor cell including a section of the drift region and a body region having dopants of a second conductivity type complementary to the first conductivity type, wherein a transition between the body region and the drift region forms a pn-junction;
   wherein the semiconductor body further comprises:
   at least one first semiconductor well region having dopants of the second conductivity type and being arranged external of the transistor cells and at least partially between at least two transistor cells, and extending from the surface along a vertical direction at least as deep as each of the body regions of the at least two transistor cells;

at least one second semiconductor well region having dopants of the second conductivity type and being arranged external of the transistor cells, wherein the at least one second semiconductor well region is electrically connected with the first load contact; and at least one separation region extending from the surface along the vertical direction and having dop ants of the first conductivity type and being arranged between and in contact with each of the at least one first semiconductor well region and the at least one second semiconductor well region, wherein a transition in a first lateral direction between the at least one separation region and the at least one first semiconductor well region extends continuously from the surface to a point in the semiconductor body positioned at least as deep as each of the body regions of the at least two transistor cells.

2. The semiconductor device of claim 1, wherein the at least one second semiconductor well region is arranged at least partially between at least two transistor cells and extends from the surface along the vertical direction at least as deep as each of the body regions of the at least two transistor cells.

3. The semiconductor device of claim 1, wherein each transistor cell further comprises at least one trench that includes a control electrode configured to control the respective transistor cell, the at least one trench extending into the semiconductor body along a vertical direction and being in contact with the body region and the drift region.

4. The semiconductor device of claim 3, wherein the at least one first semiconductor well region and/or the at least one second semiconductor well region extends from the surface along the vertical direction at least as deep as each of the trenches of the at least two transistor cells.

5. The semiconductor device of claim 3, wherein each of the trenches has a trench bottom, and wherein the at least one first semiconductor well region and/or the at least one second semiconductor well region cover the trench bottoms of the at least two transistor cells at least partially.

6. The semiconductor device of claim 1, wherein the at least one first semiconductor well region is insulated from the first load contact.

7. The semiconductor device of claim 1, wherein the semiconductor device is a reverse conducting IGBT.

8. The semiconductor device of claim 1, further comprising at least one short region having dop ants of the first conductivity type, the short region being arranged in contact with each of the drift region and a second load contact arranged at a backside of the semiconductor body, the backside being located opposite to the surface, wherein the at least one second semiconductor well region and the at least one short region exhibit a common lateral extension range along at least one of the first lateral direction and a second lateral direction.

9. The semiconductor device of claim 1, wherein the at least one second semiconductor well region forms a part of junction termination structure of the semiconductor device.

10. A semiconductor device comprising a semiconductor body having a surface, the semiconductor body comprising:

an active zone including a plurality of transistor cells, each transistor cell including a section of a drift region having dopants of a first conductivity type and a body region having dopants of a second conductivity type complementary to the first conductivity type, wherein a transition between the body region and the drift region forms a pn-junction; and an edge zone surrounding the active zone and forming lateral edges of the semiconductor body;

wherein the active zone further comprises at least one first semiconductor well region having dopants of the second conductivity type and being arranged external of the transistor cells and at least partially between at least two transistor cells, and extending from the surface along a vertical direction at least as deep as each of the body regions of the at least two transistor cells; and the edge zone and the active zone each comprise at least one second semiconductor well region having dop ants of the second conductivity type and being arranged external of the transistor cells; and wherein at least one first separation region is arranged between and in contact with each of the at least one first semiconductor well region and the at least one second semiconductor well region located in the active zone, the at least one first separation region extending from the surface along the vertical direction and having dop ants of the first conductivity type; and at least one second separation region is arranged between and in contact with each of the at least one first semiconductor well region and the at least one second semiconductor well region located in the edge zone, the at least one second separation region extending from the surface along the vertical direction and having dopants of the first conductivity type.

11. The semiconductor device of claim 10, wherein at least one of a first transition in a first lateral direction between the at least one first separation region and the at least one first semiconductor well region and a second transition in a first lateral direction between the at least one second separation region and the at least one first semiconductor well region extends continuously from the surface to a point in the semiconductor body positioned at least as deep as each of the body regions of the at least two transistor cells.

12. The semiconductor device of claim 10, further comprising a first load terminal configured to feed a load current into the semiconductor body and being arranged in contact with the surface, wherein at least one of the at least one second semiconductor well region located in the active zone and the at least one second semiconductor well region located in the edge zone is electrically connected with the first load contact.

13. The semiconductor device of claim 10, wherein a plurality of transistor cells are embedded at least partially in the at least one first separation region and/or in the at least one second separation region.

14. The semiconductor device of claim 1, wherein the plurality of transistor cells are arranged along at least one horizontal path that extends in an angle greater than 5° and smaller than 85° with respect to at least one lateral edge of the semiconductor body.

15. The semiconductor device of claim 10, wherein the plurality of transistor cells are arranged along at least one horizontal path that extends in an angle greater than 5° and smaller than 85° with respect to the at least one lateral edge of the semiconductor body.

* * * * *

UNITED STATES PATENT AND TRADEMARK OFFICE
CERTIFICATE OF CORRECTION

| | | |
|---|---|---|
| PATENT NO. | : 9,865,717 B2 | Page 1 of 1 |
| APPLICATION NO. | : 15/337094 | |
| DATED | : January 9, 2018 | |
| INVENTOR(S) | : Stephan Voss and Frank Dieter Pfirsch | |

It is certified that error appears in the above-identified patent and that said Letters Patent is hereby corrected as shown below:

In the Specification

At Column 1, Line 29, after the word "having", delete "dop ants" and insert therefor --dopants--.

At Column 1, Line 61, after the word "having", delete "dop ants" and insert therefor --dopants--.

At Column 2, Line 46, after the word "has", delete "dop ants" and insert therefor --dopants--.

In the Claims

In Claim 1, at Column 16, Line 66-67, after the word "having", delete "dop ants" and insert therefor --dopants--.

In Claim 1, at Column 17, Line 12, after the word "having", delete "dop ants" and insert therefor --dopants--.

In Claim 8, at Column 17, Line 51, after the word "having", delete "dop ants" and insert therefor --dopants--.

In Claim 10, at Column 18, Line 17, after the word "having", delete "dop ants" and insert therefor --dopants--.

In Claim 10, at Column 18, Line 17, after the word "having", delete "dop ants" and insert therefor --dopants--.

Signed and Sealed this
First Day of May, 2018

Andrei Iancu
*Director of the United States Patent and Trademark Office*